US011005017B2

(12) United States Patent
Crompvoets et al.

(10) Patent No.: US 11,005,017 B2
(45) Date of Patent: May 11, 2021

(54) LIGHT SOURCE

(71) Applicant: KONINKLIJKE PHILIPS N.V., Eindhoven (NL)

(72) Inventors: Floris Maria Hermansz Crompvoets, Bunde (NL); Benno Spinger, Aachen (DE); Pascal Jean Henri Bloemen, Eindhoven (NL); Norbertus Antonius Maria Sweegers, Lierop (NL); Marc André De Samber, Eindhoven (NL)

(73) Assignee: KONINKLIJKE PHILIPS N.V.

( * ) Notice: Subject to any disclaimer, the term of this patent is extended or adjusted under 35 U.S.C. 154(b) by 396 days.

(21) Appl. No.: 15/506,663

(22) PCT Filed: Aug. 26, 2015

(86) PCT No.: PCT/EP2015/069513
§ 371 (c)(1),
(2) Date: Feb. 24, 2017

(87) PCT Pub. No.: WO2016/034469
PCT Pub. Date: Mar. 10, 2016

(65) Prior Publication Data
US 2017/0256690 A1    Sep. 7, 2017

(30) Foreign Application Priority Data

Sep. 2, 2014 (EP) .................................. 14183131

(51) Int. Cl.
*H01L 33/60* (2010.01)
*H01L 33/46* (2010.01)
(Continued)

(52) U.S. Cl.
CPC .............. *H01L 33/60* (2013.01); *H01L 33/46* (2013.01); *H01L 33/502* (2013.01); *H01L 33/58* (2013.01);
(Continued)

(58) Field of Classification Search
CPC ....... H01L 33/46; H01L 33/502; H01L 33/60; H01L 51/5271; H01L 2933/0058;
(Continued)

(56) References Cited

U.S. PATENT DOCUMENTS 6,433,853 B1 * 8/2002 Kameyama .......... G02B 5/3016
349/115
8,573,784 B2   11/2013 Yeh et al.
(Continued)

FOREIGN PATENT DOCUMENTS

CN    1742383 A    3/2006
CN   102257651 A   11/2011
(Continued)

OTHER PUBLICATIONS

IEEE Electron Device Letters, vol. 35, No. 6, Jun. 2014 (Year: 2014).*

(Continued)

*Primary Examiner* — Jarrett J Stark (57) ABSTRACT

There is proposed a light source comprising: a semiconductor diode structure adapted to generate light; and an optical enhancement section above the semiconductor diode structure and adapted to output light from the semiconductor diode structure. A partially-reflective layer covers at least a portion of the top of the optical enhancement section and is adapted to reflect a portion of the output light towards the optical enhancement section. The partially-reflective layer has a light transmittance characteristic that varies laterally.

20 Claims, 7 Drawing Sheets

(51) Int. Cl.
  *H01L 33/50* (2010.01)
  *H01L 51/52* (2006.01)
  *H01L 33/58* (2010.01)
(52) U.S. Cl.
  CPC .. *H01L 51/5271* (2013.01); *H01L 2933/0025* (2013.01); *H01L 2933/0058* (2013.01)
(58) Field of Classification Search
  CPC ............. H01L 2933/0025; H01L 33/54; H01L 2933/005; H01L 33/58–60; H01L 2933/0091; H01L 2933/0083
  See application file for complete search history.

(56) References Cited

U.S. PATENT DOCUMENTS

| | | | |
|---|---|---|---|
| 8,916,886 B2 | 12/2014 | Engl et al. | |
| 2002/0085601 A1* | 7/2002 | Wang | C09K 11/7774 372/43.01 |
| 2003/0176124 A1* | 9/2003 | Koike | B32B 17/10018 442/16 |
| 2004/0042199 A1 | 3/2004 | Cok | |
| 2004/0144987 A1 | 7/2004 | Ouderkirk et al. | |
| 2005/0093008 A1* | 5/2005 | Suehiro | H01L 33/44 257/98 |
| 2005/0201109 A1* | 9/2005 | Shimura | F21V 5/007 362/382 |
| 2005/0207007 A1* | 9/2005 | Shimoda | G03B 21/602 359/449 |
| 2006/0239006 A1* | 10/2006 | Chaves | G02B 6/0018 362/294 |
| 2006/0255353 A1* | 11/2006 | Taskar | F21V 5/10 257/98 |
| 2007/0045644 A1* | 3/2007 | Han | H01L 33/58 257/98 |
| 2008/0261378 A1* | 10/2008 | Yao | C30B 25/02 438/458 |
| 2009/0236619 A1* | 9/2009 | Chakroborty | H01L 33/44 257/89 |
| 2009/0295265 A1* | 12/2009 | Tabuchi | H01L 33/56 313/112 |
| 2010/0321611 A1* | 12/2010 | Fujii | G02B 5/3058 349/62 |
| 2011/0001151 A1 | 1/2011 | Le Toquin | |
| 2011/0018024 A1* | 1/2011 | Fukshima | H01L 33/387 257/98 |
| 2011/0075408 A1* | 3/2011 | Negley | F21V 3/02 362/231 |
| 2011/0075410 A1* | 3/2011 | Negley | G02B 5/0236 362/231 |
| 2011/0260184 A1* | 10/2011 | Furuyama | H01L 33/38 257/98 |
| 2011/0299044 A1* | 12/2011 | Yeh | G03B 21/005 353/52 |
| 2012/0193665 A1* | 8/2012 | Yamada | H01L 33/46 257/98 |
| 2012/0205625 A1 | 8/2012 | Iza et al. | |
| 2014/0374786 A1* | 12/2014 | Bierhuizen | H01L 33/486 257/98 |
| 2015/0286006 A1* | 10/2015 | Chang-Hasnain | G02B 6/42 136/259 |
| 2015/0340565 A1 | 11/2015 | Tsutsumi | |
| 2016/0025295 A1* | 1/2016 | Merrow | F21V 15/01 362/158 |
| 2016/0300704 A1* | 10/2016 | Zukawa | H01J 9/268 |

FOREIGN PATENT DOCUMENTS

| | | |
|---|---|---|
| CN | 102341740 A | 2/2012 |
| JP | 2004063499 A | 2/2004 |
| JP | 2010056337 A | 3/2010 |
| JP | 2010539731 A | 12/2010 |
| JP | 2012513084 A | 6/2012 |
| JP | 2012516044 A | 7/2012 |
| JP | 2014072309 A | 4/2014 |
| WO | 2010070563 A2 | 6/2010 |
| WO | 2013008157 A1 | 1/2013 |
| WO | 2014122888 A1 | 8/2014 |

OTHER PUBLICATIONS

IEEE Electron Device Letters, vol. 35, No. 10, Oct. 2014 (Year: 2014).*
Journal of the Taiwan Institute of Chemical Engineers, vol. 46, Jan. 2015, pp. 168-175 (Year: 2015).*
Dow Corning Corporation for the DOE SLL Workshop, Jan. 28, 2015 p. 8 (Year: 2015).*
First Office Action dated Aug. 1, 2018, China Patent Application No. 201580047138.X, 15 pages.
Office Action dated Jul. 9, 2019, Japanese Patent Application No. 2017-511727, 10 pages.
Extended European Search Report dated Jan. 22, 2015, European Application No. 14183131.3, 7 pages.
Second Office Action dated Mar. 6, 2019, Chinese Patent Application No. 201580047138, 15 pages.
EPO as ISA, "International Search Report and Written Opinion" dated Sep. 30, 2015 from International Application No. PCT/EP2015/069513, filed Aug. 26, 2015, 10 pages.
CN 201580047138.X, "Third Office Action," dated Aug. 23, 2019, 17 pages.
JP 2017-511727, "Second Office Action," dated Feb. 25, 2020, 8 pages.

* cited by examiner

LIGHT SOURCE

CROSS-REFERENCE TO RELATED APPLICATIONS

The present application is a § 371 application of International Application No. PCT/EP2015/069513 filed on Aug. 26, 2015 and entitled "LIGHT SOURCE," which claims the benefit of European Patent Application No. 14183131.3 filed on Sep. 2, 2014. International Application No. PCT/EP2015/069513 and European Patent Application No. 14183131.3 are incorporated herein.

FIELD OF THE INVENTION

This invention relates to a light source, and more particularly to a light source comprising a semiconductor diode structure adapted to generate light.

BACKGROUND OF THE INVENTION

Semiconductor light sources, such as light emitting diodes (LEDs), high power LEDs, organic LEDs (OLEDs) and laser diodes are known to be energy efficient and small light sources that have a small/low etendue (i.e. the product of emitting area with solid angle in which the light is emitted). This implies that these semiconductor light sources emit light from a relatively small area into a limited angular range.

Such semiconductor light sources may therefore be beneficial for applications where a bright light source is needed. Typical example applications include projection systems, automotive lighting, camera flashlights, and spot lights. For these examples, it may be desirable to provide a light beam that is inhomogeneous (i.e. having a luminance that varies with position in the light beam). This is typically achieved by superimposing several images of the light source (or several light beams). Images or light beams with different magnification or luminance are overlaid so as to produce an overall output light beam having a required shape and/or luminance variation. However, such known approaches typically fail to provide an output light beam having a suitable shape and/or luminance variation

SUMMARY OF THE INVENTION

The invention is defined by the claims.

According to an aspect of the invention there is provided a light source comprising: a semiconductor structure adapted to generate light; an optical enhancement section above the semiconductor diode structure and adapted to output light from the semiconductor structure; and a partially-reflective layer covering at least a portion of the top of the optical enhancement section and adapted to reflect a portion of the output light towards the optical enhancement section, wherein the partially-reflective layer has a light transmittance characteristic that varies laterally.

Embodiments employ the concept of covering the light output surface of an LED-based light source with a partially-reflective layer of non-uniform thickness and/or reflectivity, for example. The varied thickness and/or reflectivity of the partially-reflective layer can be used to vary the amount of light transmitted through different parts/sections of the partially-reflective layer and thus alter the intensity of output light with position. For example, a thick section of the partially-reflective layer will reflect more light back towards the optical enhancement section than a thinner section of the partially-reflective layer. The thick section of the partially-reflective layer will therefore transmit less light (e.g. have a lower transmittance characteristic) than the thinner section of the partially-reflective layer. Likewise, a high-reflectivity section of the partially-reflective layer will reflect more light back towards the optical enhancement section than a low-reflectivity section of the partially-reflective layer. The high-reflectivity section of the partially-reflective layer will therefore transmit less light (e.g. have a lower transmittance characteristic) than the low-reflectivity section of the partially-reflective layer.

In other words, a partially-reflective layer having a non-uniform transmittance characteristic can be used to vary the luminance of output light, wherein the luminance of the light output through a section of the partially-reflective layer is indirectly proportional to the thickness and/or reflectivity of the section of the partially-reflective layer. The light transmittance characteristic of a partially transparent layer may therefore be varied laterally by varying the thickness and/or reflectivity of the partially transparent layer at different lateral positions.

Embodiments may be used to generate a light beam having a luminance that varies with position in the light beam. For example, a top/upper portion/section of a light beam produced using an embodiment may be brighter than a bottom/lower portion/section of the light beam. In other words, embodiments may be employed to create inhomogeneous light beams from a semiconductor light source. Such inhomogeneous light beams may be of particular use in automotive lighting, projection systems, camera flashlights, and spot lights, for example.

The semiconductor light source of the present disclosure may be any type of semiconductor-based light source, such as a light emitting diode (LED), a high power LED, organic LED (OLED) and laser diodes LED. Also, an LED may be any of type of LED, such as a Flip Chip type (Thin Film Flip Chip), Patterned Sapphire Substrate, top connected/top emission, top-bottom connected. Also, the light source could be used as naked die, or packaged.

The light output direction is generalised to be in a single direction (e.g. vertical in the Figures) along which light is output from the mitting surface of the optical enhancement section. However, it will be understood that not all light may be output exactly along the output direction. Thus, the light output direction should be understood to refer to the general direction along which light is output from an optical enhancement section, extending away from the upper surface of the optical enhancement section for example.

In an embodiment, the partially-reflective layer may be formed such that, at a first position, the partially-reflective layer has a first thickness and, at a second position, the partially-reflective layer has a second, different thickness.

In another embodiment, the partially-reflective layer may be formed such that, at a first position, the partially-reflective layer has a first reflectivity and, at a second position, the partially-reflective layer has a second, different reflectivity. The partially-reflective layer may have a reflectivity which is specular, diffuse or a combination of both, for example.

In an embodiment, the partially-reflective layer may comprise a plurality of partially-reflective sub-layers. The partially-reflective layer may therefore be built up from multiple sub-layers of equal or varying thickness. This may enable accurate control of the thickness and/or reflectivity of the partially-reflective layer at various locations/positions in the partially-reflective layer. Also, it may enable the use of pre-fabricated partially-reflective sub-layers manufactured to have a predetermined reflectivity, shape and/or thickness.

Also, at the first position, the partially-reflective layer may comprise a first number of partially-reflective sub-layers and, at the second position, the partially-reflective layer may comprise a second, different number of partially-reflective sub-layers. The partially-reflective layer may therefore be built up from multiple sub-layers of equal or differing thickness, wherein different numbers of the sub-layers are employed at different locations/positions in the partially-reflective layer. A sudden/step change in the thickness or reflectivity of the partially-reflective layer may therefore be easily realised, for example by adding a partially-reflective sub-layer at a predetermined location/position in the partially-reflective layer. A sudden/step change in the thickness or reflectivity of the partially-reflective layer may be used to provide a corresponding sudden/step change in luminance at a predetermined location/position of a light beam.

Also, between the first and second positions, the thickness and/or reflectivity may gradually change from a first value to a second value in a monotonic fashion.

Embodiments may further comprise a light reflecting structure at least partially enclosing side surfaces of the semiconductor structure and the optical enhancement section, the light reflecting structure being adapted to reflect light from the semiconductor diode structure towards the optical enhancement section. The light reflecting structure may acts as a "mix-box" having high reflectivity which recycles/reflects light until it escapes via optical enhancement section and the partially-reflective layer. Further, the light output section from which the light escapes may be adapted to be smaller in area/footprint than the semiconductor structure which generates the light, thereby increasing the luminance of light output from the light source.

Embodiments may further comprise a masking layer covering at least a portion of the top of the optical enhancement section, the masking layer being adapted to block the transmission of output light incident on its downwardly facing surface. The masking layer may be employed to create dark (e.g. low luminance) areas in a light output beam, for example. Such dark areas may be well-defined (e.g. have a sharp or abrupt change in luminance at an edge) by the masking layer providing a sudden or abrupt change in reflectivity. Further, desired shapes or patterns in an output light beam may be easily obtained by employing one or more masking layers at predetermined locations/positions on the partially-reflective layer. A sudden/step change in the thickness of the partially-reflective layer may be used to provide a corresponding sudden/step change in luminance at a predetermined location/position of a light beam.

Optical enhancement material may be a 'colour conversion fill', such as a lumiramic material or phosphorescent material. This may convert the colour of light output from the semiconductor structure. It may also help to maintain the etendue of the lateral emission area.

Embodiments may be employed in the field of automotive lighting and other fields/applications where high-luminance lighting is desirable.

Thus, according to an aspect of the invention, there may be provided an automotive light comprising a light source according to an embodiment.

According to another aspect of the invention, there may be provided a projector light comprising a light source according to an embodiment.

According to yet another aspect of the invention, there is provided a method of manufacturing a light source comprising the steps of: providing a semiconductor diode structure adapted to generate light; forming an optical enhancement section above the semiconductor diode structure, the optical enhancement section being adapted to output light from the semiconductor diode structure; and covering at least a portion of the top of the optical enhancement section with a partially-reflective layer, the partially-reflective layer being adapted to reflect a portion of the output light towards the optical enhancement section, wherein the partially transparent layer has a light transmittance characteristic that varies laterally.

The method may further comprise the step of forming the partially-reflective layer from a plurality of partially-reflective sub-layers.

Embodiments may further comprise at least partially enclosing side surfaces of the semiconductor structure and the optical enhancement section with a light reflecting structure, the light reflecting structure being adapted to reflect light from the semiconductor diode structure towards the optical enhancement section.

An embodiment may further comprise the step of covering at least a portion of the top of the optical enhancement section with a masking layer, the masking layer being adapted to block the transmission of output light incident on its downwardly facing surface.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a light source comprising a plurality of LED light sources and a method for manufacturing the same. Embodiments may be of particular relevance to applications that require output light of varying intensity in varying directions from a relatively small and/or efficient light source.

Embodiments employ the concept of covering at least part of a light output surface of an LED-based light source with a partially-reflective layer having an overall light transmittance characteristic that varies laterally. The non-uniform light transmittance characteristic of the partially-reflective layer can be used to modify the amount of light transmitted through different parts/sections of the partially-reflective layer and thus alter the luminance of output light with position. For example, a thicker section of the partially-reflective layer will reflect more light back towards the light source than a thinner section of the partially-reflective layer. By way of another example, a high-reflectivity section of the partially-reflective layer will reflect more light back towards the light source than a low reflectivity section of the partially-reflective layer. Put another way, a thicker or high-reflectivity section of the partially-reflective layer will transmit less light (and thus have a lower overall light transmittance characteristic) than the thinner or high-reflectivity section of the partially-reflective layer. The luminance of light output through a particular portion of the partially-reflective layer will thus be indirectly proportional to the thickness or reflectivity of that portion of the partially-reflective layer. By adapting the thickness and/or reflectivity of the partially-reflective layer at predetermined positions/sections, the luminance at predetermined positions/sections of a light beam output through the partially-reflective layer can be altered so as to meet predetermined requirements. In other words, a light beam output through a non-uniform partially-reflective layer in accordance with an embodiment, can be adapted to be inhomogeneous (with inhomogeneity corresponding to the non-uniformity of the partially-reflective layer).

The term vertical, as used herein, means substantially orthogonal to the surface of a substrate. The term lateral, as used herein, means substantially parallel to the surface of a substrate. Also, terms describing positioning or location (such as above, below, top, bottom, etc.) are to be construed in conjunction with the orientation of the structures illustrated in the diagrams.

The diagrams are purely schematic and it should therefore be understood that the dimensions of features are not drawn to scale. Accordingly, the illustrated thickness of any of the layers should not be taken as limiting. For example, a first layer drawn as being thicker than a second layer may, in practice, be thinner than the second layer.

Figure 1A:
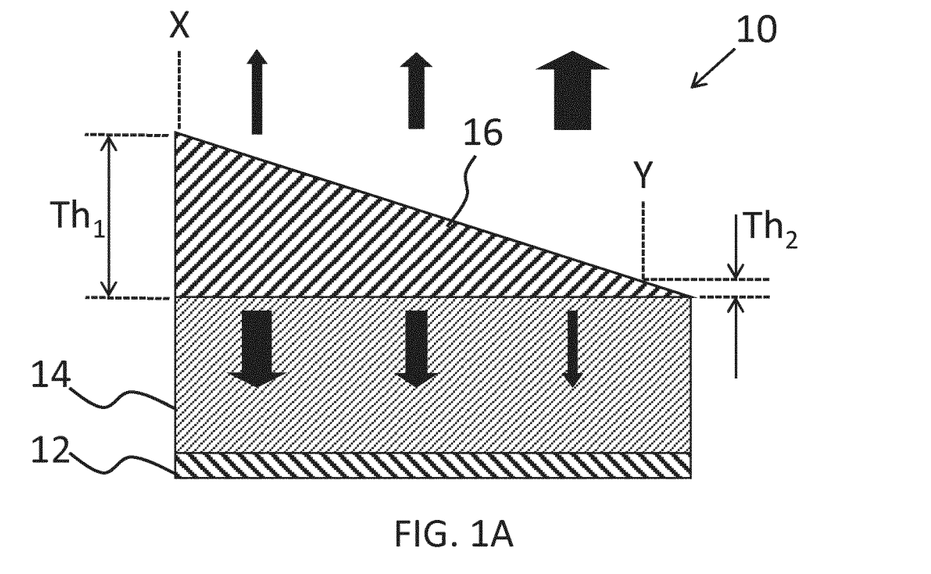
FIG. 1A is a cross-sectional view of a light source according to an embodiment.

Referring to FIG. 1A, there is depicted a cross-sectional view of a light source 10 according to an embodiment. The light source 10 comprises a bottom or lowermost layer 12 which is a semiconductor diode structure 12 adapted to generate light (e.g. a LED or an OLED). Above (and directly on top of) the semiconductor diode structure 12, there is an optical enhancement section 14 which is adapted to output light from the semiconductor diode structure 12.

Here, the optical enhancement section 14 comprises optical enhancement material (such as a lumiramic material or phosphorescent material) which is adapted to convert the colour of light output from the semiconductor diode structure 12. It is also noted that the optical enhancement section 14 has a substantially flat (i.e. planar) top/upper surface.

Covering the upper surface of the optical enhancement section 14 is a partially-reflective layer 16 which is adapted to reflect a portion of the output light (from the optical enhancement section 14) back towards the optical enhancement section 14. The partially-reflective layer 16 is formed from silicone with between 0.5-5% Titanium Oxide ($TiO_2$). In other words, the partially-reflective layer 16 comprises Si with a low $TiO_2$ concentration.

The partially transparent layer 16 has a non-uniform thickness, such that, at a first position X, the partially-reflective layer 16 has a first thickness $Th_1$ and, at a second position Y, the partially-reflective layer has a second, different thickness $Th_2$. Here, between the first Y and second X positions, the thickness linearly decreases from the first thickness $Th_1$ to the second thickness $Th_2$ in a monotonic fashion, such that $Th_2<Th_1$.

This may be referred to as tapered partially-reflective layer 16, since the thickness of the partially-reflective layer 16 tapers (e.g. increases or decreases) from a first thickness to a second thickness along a horizontal portion of the partially-reflective layer 16. In other words, along a horizontal segment of the partially-reflective layer, the thickness of the partially-reflective layer gradually thins or thickens due to tapering of the upper surface of the partially-reflective layer 16. Such a partially-reflective layer has a substantially flat or planar lower surface. The partially-reflective layer 16 may therefore considered as having a thickness that varies with lateral position.

In the embodiment of FIG. 1, the area where the partially-reflective layer 16 is thickest is situated at the left side and reflects a greater amount of light (i.e. allows less light to be transmitted vertically from the light source). The area where the partially-reflective layer 16 is thinnest is situated at the right side and reflects a smaller amount of light (i.e. allows more light to be transmitted vertically from the light source).

Figure 1B:
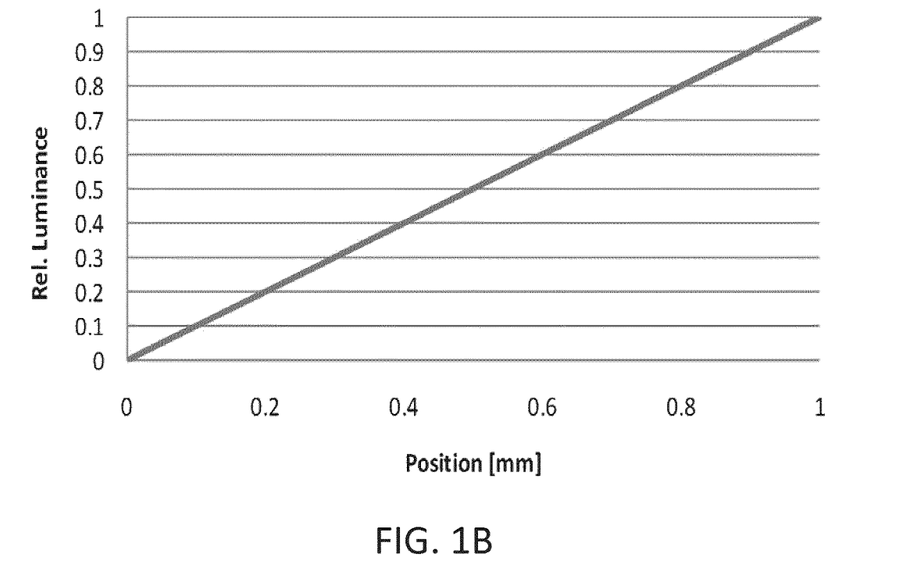
FIG. 1B is a graph illustrating the variation of the luminance of output light with position for the embodiment of FIG. 1A.

Thus, as depicted in FIG. 1B, the luminance of light outputted from the partially-reflective layer 16 increases linearly from left to right of the partially-reflective layer 16. In other words, the luminance of the light output through a part of the partially-reflective layer is indirectly proportional to the thickness of the part of the partially-reflective layer.

Figure 2A:
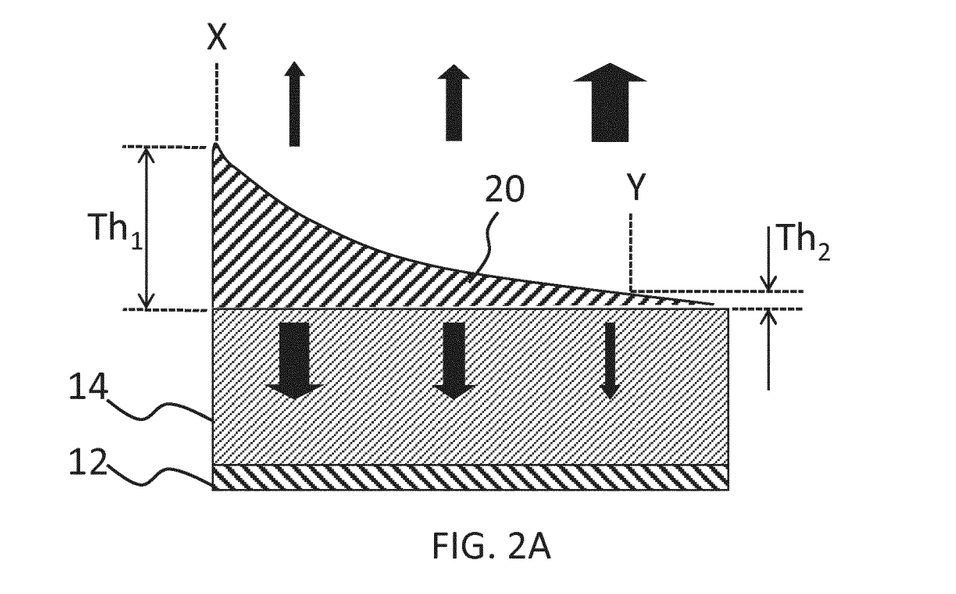
FIG. 2A is a cross-sectional view of a light source according to another embodiment.

Referring now to FIG. 2A, there is depicted a cross-sectional view of a light source according to an embodiment. The light source is similar to that of FIG. 1A in that only the feature of the partially-reflective layer 16 is different. Accordingly, detailed description of the remaining features (other than the partially-reflective layer 16) is omitted so as to avoid unnecessary repetition.

Like that of FIG. 1A, the partially transparent layer 20 of this embodiment (depicted in FIG. 2A) has a non-uniform thickness, such that, at a first position X, the partially-reflective layer 16 has a first thickness $Th_1$ and, at a second position Y, the partially-reflective layer has a second, different thickness $Th_2$. However, between the first Y and second X positions, the thickness decreases from the first thickness $Th_1$ to the second thickness $Th_2$ in a non-linear monotonic fashion, such that $Th_2<Th_1$. The upper surface of the partially transparent layer 20 is therefore curved.

The area where the partially-reflective layer 20 is thickest is situated at the left side and reflects a greater amount of light (i.e. allows less light to be transmitted vertically from the light source). The area where the partially-reflective layer 20 is thinnest is situated at the right side and reflects a smaller amount of light (i.e. allows more light to be transmitted vertically from the light source).

Figure 2B:
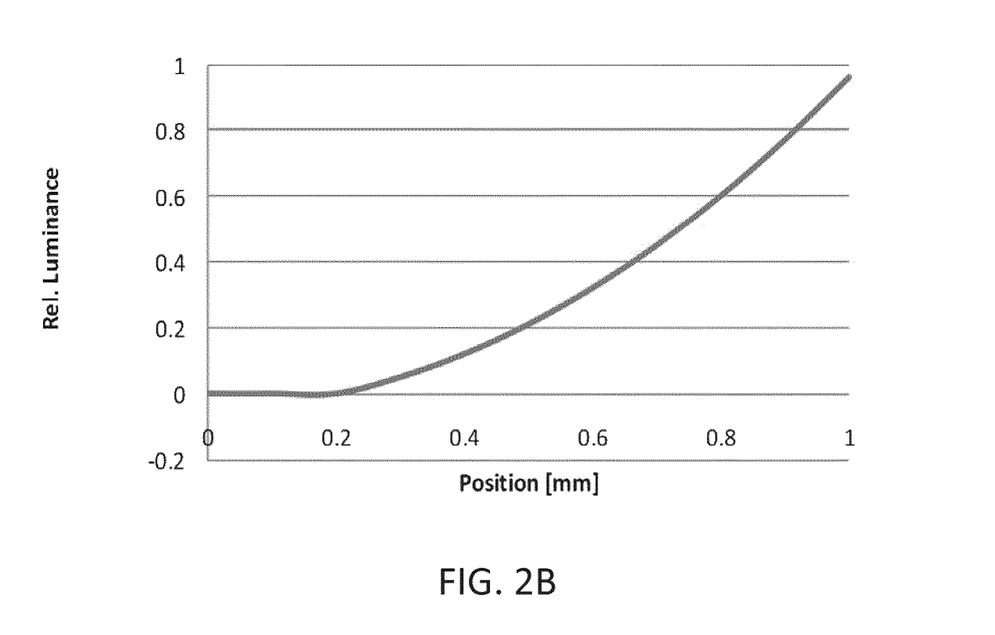
FIG. 2B is a graph illustrating the variation of the luminance of output light with position for the embodiment of FIG. 2A.

Thus, as depicted in FIG. 2B, the luminance of light outputted from the partially-reflective layer 20 increases non-linearly from left to right of the partially-reflective layer 20. The luminance of the light output through a part of the partially-reflective layer is therefore indirectly proportional to the thickness of the part of the partially-reflective layer 20.

Figure 3:
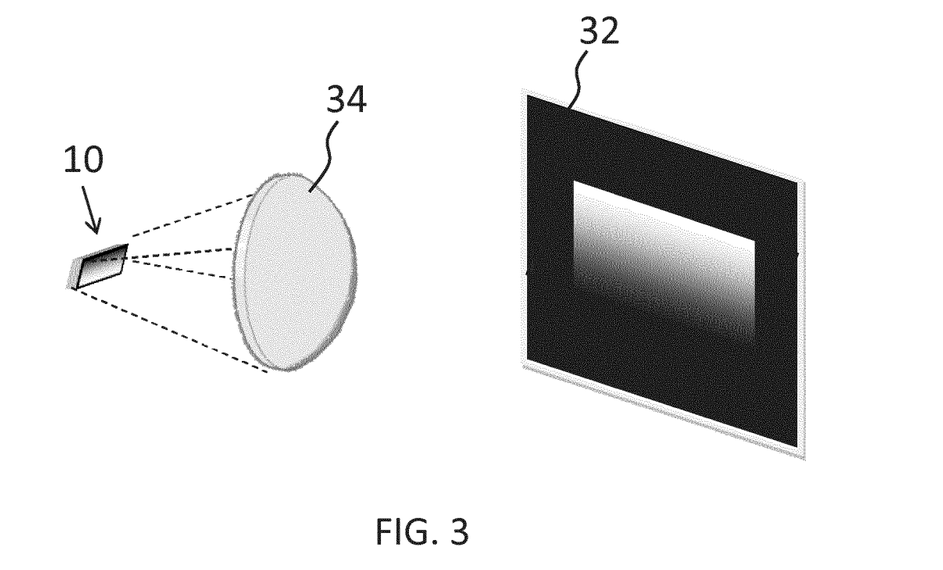
FIG. 3 depicts the use of a light source according to an embodiment, wherein the luminance variation of the light source's output light beam is illustrated.

Turning to FIG. 3, there is illustrated the use of the light source 10 of FIG. 1A, wherein the left side of the light source 10 of FIG. 1A is oriented to be at the top, and wherein the right of the light source 10 of FIG. 1A is oriented to be at the bottom.

The light source 10 outputs light through its partially-reflective layer and to a projection screen 32 via a lens 34.

From the light beam projected onto the screen 32, it can be seen that the light beam is non-homogeneous in that its luminance varies with position in the light beam. Here, the luminance varies with vertical position in the beam such that a top/upper portion/section of projected light beam (from the lens 34) is brighter than a bottom/lower portion/section of the projected light beam (from the lens). The luminance of the light beam projected onto the screen therefore increases linearly from a low value at the bottom of the light beam to a high value at the top of the light beam.

Figure 4:
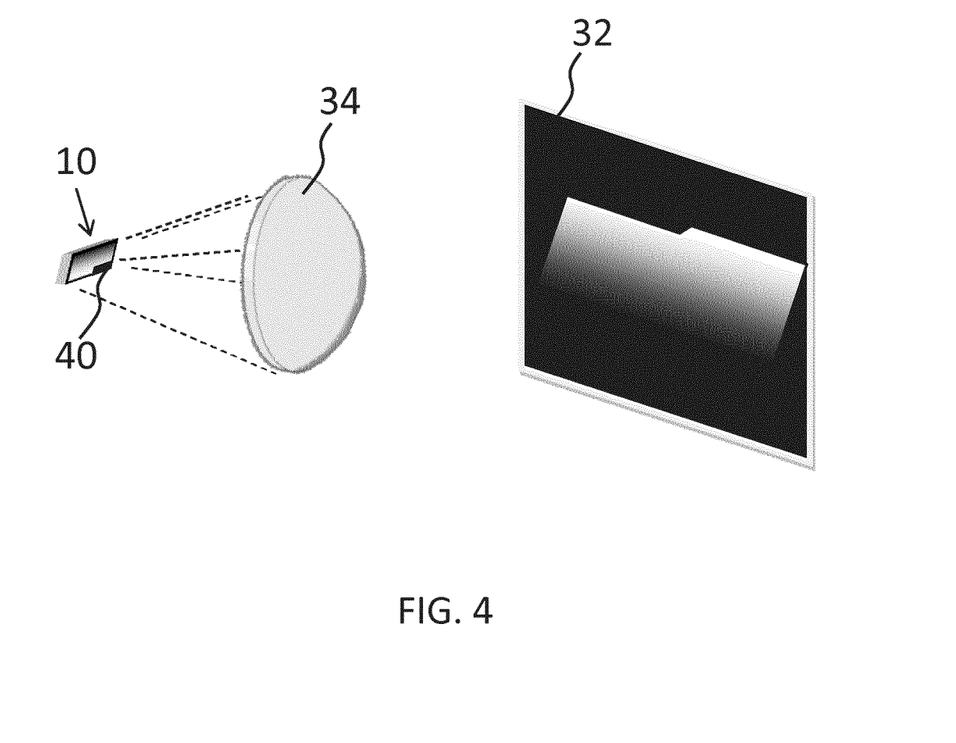
FIG. 4 depicts a modification to the embodiment of FIG. 3.

Referring now to FIG. 4, there is depicted a modification to the embodiment of FIG. 3. More specifically, the light source 10 has been modified so as to further comprise a masking layer 40 covering a bottom-right section of the optical enhancement section.

The masking layer 40 is oblong-shaped and adapted to block the transmission of output light from the light source 10. More specifically, in this example, the masking layer 40 is formed from silicone with greater than 20% Titanium Oxide (TiO2). In other words, the masking layer 40 comprises Si with a high $TiO_2$ concentration.

From the light beam projected onto the screen 32, it can be seen that the light beam is non-homogeneous in that its luminance varies with position the light beam. As before with the embodiment shown in FIG. 3, the luminance varies with vertical position in the beam such that a top/upper portion/section of projected light beam (from the lens 34) is brighter than a bottom/lower portion/section of the projected light beam (from the lens). However, there is a dark (i.e. low luminance) section at the upper-left position in the light beam which corresponds with the position of the masking layer 40.

It will therefore be appreciated that the masking layer creates a dark (e.g. low luminance) area in the light beam projected onto the screen 32. The dark area is well-defined (e.g. there is a sharp or abrupt change in luminance at its edges) as a result of the masking layer 40 creating a sudden or abrupt change in reflectivity.

Figure 5:
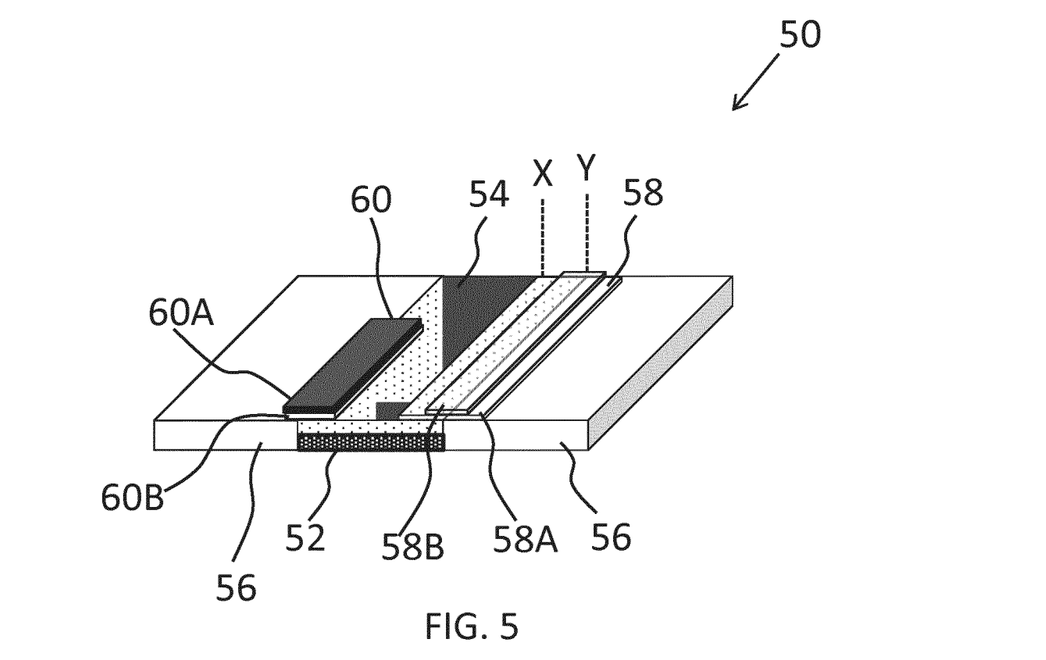
FIG. 5 is an isometric view of a light source according to an embodiment.

Referring to FIG. 5, there is shown an isometric view of a light source 50 according to another embodiment.

The light source 50 comprises a semiconductor diode structure 52 adapted to generate light (such as a LED or an OLED), and an optical enhancement section 54 stacked directly on top of the semiconductor diode structure 52. The optical enhancement section 54 comprises optical enhancement material (such as a lumiramic material or phosphorescent material) which is adapted to convert the colour of light output from the semiconductor diode structure 52.

A light reflecting structure 56 encloses the side surfaces of the semiconductor diode structure 52 and the optical enhancement section 54. The light reflecting structure 56 is formed from highly reflective material such that it is adapted to reflect light from the semiconductor diode structure 52 towards the optical enhancement section 54.

It is noted that the thickness of the light reflecting structure 56 is the same as the combined thickness of the semiconductor diode structure 52 and the optical enhancement section 54. In this way, the upper surface of the light reflecting structure 56 and the upper surface of the optical enhancement section 54 are co-planar, thus providing a substantially flat (i.e. planar) top/upper surface.

Covering a portion of the upper surface of the light reflecting structure 56 and the optical enhancement section 54 is a partially-reflective layer 58 which is adapted to reflect a portion of the output light (from the optical enhancement section 54) back towards the optical enhancement section 54.

Here, the partially-reflective layer 58 comprises two partially-reflective sub-layers 58A and 58B. The two partially-reflective sub-layers 58A and 58B are of equal thickness, and the second partially-reflective sub-layer 58B is stacked on top of the first partially-reflective sub-layer 58A. Further, the second partially-reflective sub-layer 58B is of lesser width than the first partially-reflective sub-layer 58A, such that a portion of the first partially-reflective sub-layer 58A is not covered by the second partially-reflective sub-layer 58B. Consequently, at a first position X, the partially-reflective layer 58 comprises a single partially-reflective sub-layer 58A and, at a second position Y, the partially-reflective layer comprises two partially-reflective sub-layers 58A and 58B. The partially-reflective layer 58 therefore a non-uniform thickness, such that, at the first position X, the partially-reflective layer 58 has a first thickness (equal to the thickness of the first partially-reflective sub-layer 58A) and, at the second position Y, the partially-reflective layer 58 has a second, different thickness (equal to the combined thickness of the first 58A and second 58B partially-reflective sub-layers).

Accordingly, it will be understood that partially-reflective layer 58 has two areas of differing thickness. More specifically, the partially-reflective layer 58 extends upwardly from the upper surface of the semiconductor light source so that in a first area (towards its outer left and right edges) the partially-reflective layer has a first thickness and so that in a second area (towards it centre) the partially-reflective layer 58 has a second, larger thickness.

Here, between the first Y and second X positions, the thickness suddenly changes (at the edge of the second partially-reflective sub-layer 58B).

The light source 50 also comprises a masking layer 60 covering a portion of the upper surface of the light reflecting structure 56 and the optical enhancement section 54. The masking layer 60 comprises a black layer 60A on top of a white layer 60B, and is adapted to block the transmission of output light from portion of the optical enhancement section 54 that it covers. Use of such black 60A and white 60B sub-layers may help to increase the contrast.

In the embodiment of FIG. 5, the area where the partially-reflective layer 58 is thickest is situated at the right side of the optical enhancement section 54 and reflects a greater amount of light (i.e. allows less light to be transmitted vertically from the light source). Also, the area where the masking layer is situated is at one end of the left side of the optical enhancement section 54 and this blocks transmission of light (i.e. prevents light being transmitted vertically from the light source).

Accurate control of the thickness and/or location of the partially-reflective layer and/or the masking layer can be obtained. Further, use of pre-fabricated partially-reflective sub-layers and/or making layers may enable the provision of light beams having desired variations in luminance with position.

Figure 6:
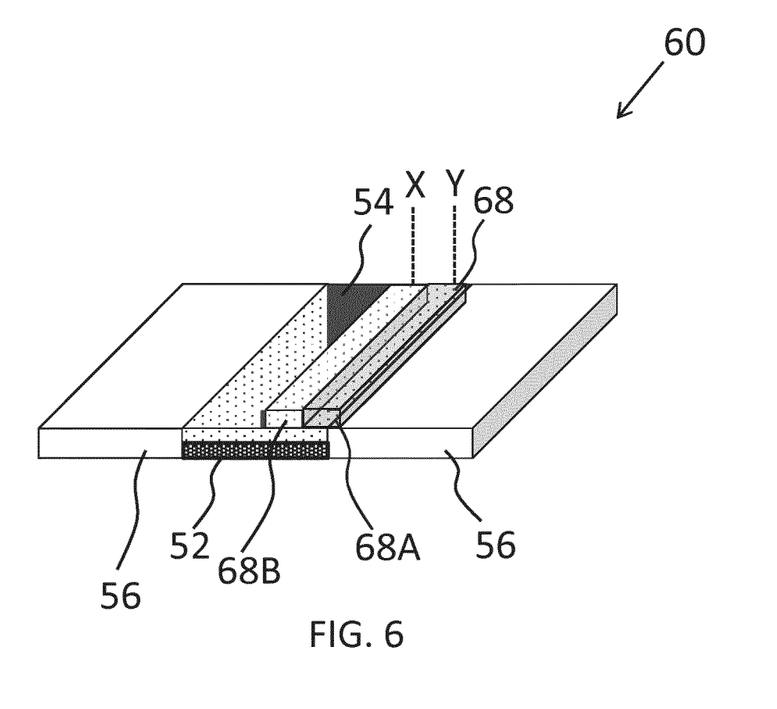
FIG. 6 is an isometric view of a light source according to another embodiment.

Referring to FIG. 6, there is shown an isometric view of a light source 60 according to yet another embodiment.

Like the embodiment of FIG. 5, the light source 50 comprises a semiconductor diode structure 52 adapted to generate light (such as a LED or an OLED), and an optical enhancement section 54 stacked directly on top of the semiconductor diode structure 52. The optical enhancement section 54 comprises optical enhancement material (such as a lumiramic material or phosphorescent material) which is adapted to convert the colour of light output from the semiconductor diode structure 52.

A light reflecting structure 56 encloses the side surfaces of the semiconductor diode structure 52 and the optical enhancement section 54. The light reflecting structure 56 is formed from highly reflective material such that it is adapted to reflect light from the semiconductor diode structure 52 towards the optical enhancement section 54.

As with the embodiment of FIG. 5, the thickness of the light reflecting structure 56 is the same as the combined thickness of the semiconductor diode structure 52 and the optical enhancement section 54. In this way, the upper surface of the light reflecting structure 56 and the upper surface of the optical enhancement section 54 are co-planar, thus providing a substantially flat (i.e. planar) top/upper surface.

Covering a portion of the upper surface of the light reflecting structure 56 and the optical enhancement section 54 is a partially-reflective layer 68 which is adapted to reflect a portion of the output light (from the optical enhancement section 54) back towards the optical enhancement section 54.

Here, the partially-reflective layer 68 comprises two partially-reflective sub-layers 68A and 68B. The two partially-reflective sub-layers 68A and 68B are of equal thickness, and the second partially-reflective sub-layer 68B is adjacent (and parallel) to the first partially-reflective sub-layer 68A.

Further, the second partially-reflective sub-layer 58B is of greater reflectivity than the first partially-reflective sub-layer 68A. More specifically, the second partially-reflective sub-layer 58B has a higher TiO2 concentration than the first partially-reflective sub-layer 68A. Consequently, at a first position X, the partially-reflective layer 58 has first reflectivity and, at a second position Y, the partially-reflective layer 58 has a second, higher reflectivity. The partially-reflective layer 58 therefore has a transmittance characteristic that varies laterally. In other words, the partially-reflective layer 58 therefore has a non-uniform transmittance property, such that, at the first position X, the partially-reflective layer 58 has a first overall transmittance value and, at the second position Y, the partially-reflective layer 58 has a second, different overall transmittance value.

Accordingly, it will be understood that partially-reflective layer 58 has two areas of differing reflectivity. More specifically, the partially-reflective layer 58 extends upwardly from the upper surface of the semiconductor light source so that in a first area (towards its right side) the partially-reflective layer has a first reflectivity and so that in a second area (towards its left side) the partially-reflective layer 58 has a second, lower reflectivity.

Here, between the first Y and second X positions, the reflectivity suddenly changes (at the adjacent edges of the partially-reflective sub-layers 68A and 68B).

In the embodiment of FIG. 6, the area where the partially-reflective layer 58 is of greater reflectivity is situated at the right side of the optical enhancement section 54 and reflects a greater amount of light (i.e. allows less light to be transmitted vertically from the light source).

Accurate control of the reflectivity and/or location of the partially-reflective layer(s) may be achieved. Further, use of pre-fabricated partially-reflective sub-layers and/or making layers may enable the provision of light beams having desired variations in luminance with position.

Figure 7A:
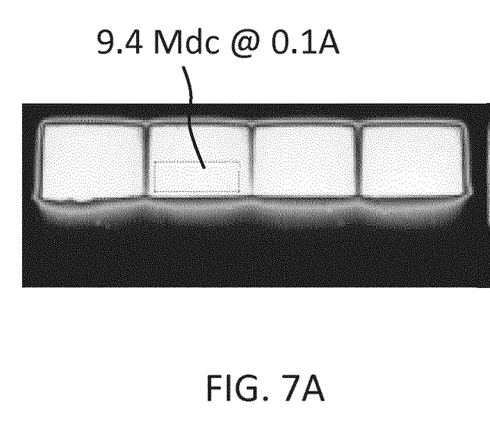
FIG. 7A illustrates the output light of a light source according to embodiment.
Figure 7B:
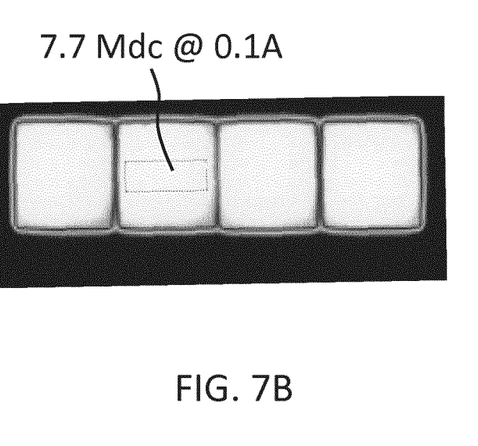
FIG. 7B illustrates the output light of a conventional light source.

FIGS. 7A and 7B provide a comparison of light output from a light source according to embodiment against light output from a convention light source. More specifically, FIG. 7B illustrates the light output from a conventional light source, whereas FIG. 7B illustrates the light output from the same conventional light source but further comprising a reflective film of Silicon covering the lower third (⅓) of the emitting surface of the light source.

From FIG. 7A, it can be seen that the embodiment comprising the partially-reflective silicone cover exhibits not only light of increased (peak) luminance (9.4 Mdc versus 7.7 Mdc for the conventional light source of FIG. 7B), but also exhibits output light which gradually increases in luminance in the lower third (⅓) of the emitting surface.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A light source comprising:
   a semiconductor diode structure adapted to generate light;
   an optical enhancement section above the semiconductor diode structure, the optical enhancement section comprising a first light emitting surface having a first edge and a second edge oppositely disposed in a horizontal direction from the first edge and being adapted to output light from the semiconductor diode structure; and
   a partially-reflective layer covering at least a portion of the first light emitting surface of the optical enhancement section, comprising reflective particles within a binder, and having a lesser thickness at a first position and a greater thickness at a second position that is a horizontally different position from the first position, the partially-reflective layer being adapted to reflect a portion of the output light towards the optical enhancement section, such that the partially-reflective layer transmits more light through the lesser thickness than through the greater thickness, and the partially-reflective layer at the greater thickness reflects more light back towards the optical enhancement section than the partially-reflective layer at the lesser thickness.

2. The light source of claim 1, wherein, the partially-reflective layer comprises a plurality of partially-reflective sub-layers, and comprises a first number of partially-reflective sub-layers at the first position that is greater than a second number of partially-reflective sub-layers at the second position.

3. The light source of claim 2, wherein each of the plurality of partially-reflective sub-layers have different reflectivity.

4. The light source of claim 2, wherein each of the plurality of partially-reflective sub-layers has a same length measured in a first direction perpendicular to the first thickness and the second thickness and parallel to the horizontal direction.

5. The light source claim 1, wherein at two or more positions between the first position and the second position, a reflectivity gradually changes monotonically.

6. The light source of claim 1, further comprising a masking layer covering at least a portion of the top of the optical enhancement section, the masking layer being adapted to block transmission of output light incident on its downwardly facing surface.

7. The light source of claim 6, wherein the masking layer comprises a black layer and a white layer, the black layer disposed on the white layer.

8. The light source of claim 1, wherein the optical enhancement section comprises at least one of, a lumiramic or phosphorescent material.

9. The light source of claim 1, wherein the semiconductor diode structure comprises a pre-structured sapphire LED.

10. The light source of claim 1, further comprising at least a portion of an automotive light.

11. The light source of claim 1, further comprising at least a portion of a projector light.

12. The light source of claim 1, wherein the partially-reflective layer does not cover an entire area of the first light emitting surface.

13. The light source of claim 1, wherein the second position having the greater thickness is the second edge, and the partially-reflective layer decreases in thickness from the second edge to the first edge without increasing in thickness in any position between the first edge and the second edge.

14. The light source of claim 13, wherein a slope measuring thickness with respect to position, and taken from the second edge to the first edge, is a straight line.

15. The light source of claim 13, wherein a slope measuring thickness with respect to position, and taken from a position closer to the second edge to a position farther from the second edge, is a curve.

16. The light source of claim 1, wherein the partially-reflective layer is thicker at the second edge than at a center position centered in the horizontal direction between the first edge and the second edge.

17. The light source of claim 16, wherein, at the center position, the partially-reflective layer transmits half an amount of light compared to that transmitted at the first edge.

18. The light source of claim 1, wherein no light is transmitted through the greater thickness of the partially-reflective layer at the second position.

19. A method of manufacturing a light source comprising the steps of:
providing a semiconductor diode structure adapted to generate light;
forming an optical enhancement section above the semiconductor diode structure, the optical enhancement section being adapted to output light from the semiconductor diode structure; and
forming a partially-reflective layer covering at least a portion of the first light emitting surface of the optical enhancement section, comprising reflective particles within a binder, and having a lesser thickness at a first position and a greater thickness at a second position that is a horizontally different position from the first position, the partially-reflective layer being adapted to reflect a portion of the output light towards the optical enhancement section, such that the partially-reflective layer transmits more light through the lesser thickness than through the greater thickness, and the partially-reflective layer at the greater thickness reflects more light back towards the optical enhancement section than the partially-reflective layer at the lesser thickness.

20. The method of claim 19, further comprising:
providing a light reflecting structure, the light reflecting structure at least partially enclosing side surfaces of the semiconductor structure and the optical enhancement section, the light reflecting structure being adapted to reflect light from the semiconductor diode structure towards the optical enhancement section.

* * * * *